US012800384B2

(12) United States Patent
Jiang et al.

(10) Patent No.: US 12,800,384 B2
(45) Date of Patent: Nov. 17, 2026

(54) UNSUPERVISED TRANSFORMER SIGNAL SEPARATION

(71) Applicant: NEC Laboratories America, Inc., Princeton, NJ (US)

(72) Inventors: Zhuocheng Jiang, Plainsboro, NJ (US); Yue Tian, Princeton, NJ (US); Yangmin Ding, East Brunswick, NJ (US); Sarper Ozharar, Pennington, NJ (US); Yanchao Wang, Princeton, NJ (US); Ting Wang, West Windsor, NJ (US)

(73) Assignee: NEC Corporation, Tokyo (JP)

( * ) Notice: Subject to any disclaimer, the term of this patent is extended or adjusted under 35 U.S.C. 154(b) by 225 days.

(21) Appl. No.: 18/917,504

(22) Filed: Oct. 16, 2024

(65) Prior Publication Data

US 2025/0146861 A1 May 8, 2025

Related U.S. Application Data

(60) Provisional application No. 63/595,791, filed on Nov. 3, 2023.

(51) Int. Cl.
*G01H 9/00* (2006.01)
*G01R 31/62* (2020.01)

(52) U.S. Cl.
CPC ............. *G01H 9/004* (2013.01); *G01R 31/62* (2020.01)

(58) Field of Classification Search
CPC ................................ G01H 9/004; G01R 31/62
See application file for complete search history.

(56) References Cited

U.S. PATENT DOCUMENTS

| | | | | |
|---|---|---|---|---|
| 11,555,939 | B2 * | 1/2023 | Wilson | G01V 1/48 |
| 12,663,307 | B2 * | 6/2026 | Liu | G01H 9/002 |
| 2020/0174149 | A1 * | 6/2020 | Thiruvenkatanathan | E21B 43/00 |
| 2022/0407597 | A1 * | 12/2022 | Amiri | H04B 10/0795 |
| 2023/0072334 | A1 * | 3/2023 | Kashimoto | G06N 3/0895 |
| 2023/0169369 | A1 * | 6/2023 | Cerrahoglu | E21B 41/00 706/12 |
| 2024/0264321 | A1 * | 8/2024 | Zhu | G01V 1/288 |
| 2025/0237139 | A1 * | 7/2025 | Cerrahoglu | G01H 17/00 |
| 2026/0030547 | A1 * | 1/2026 | Deetlefs | G06N 3/045 |

FOREIGN PATENT DOCUMENTS

| | | | | |
|---|---|---|---|---|
| CN | 110751108 A | * | 2/2020 | G06N 3/088 |
| CN | 112749637 A | * | 5/2021 | G06F 18/214 |
| CN | 114692681 A | * | 7/2022 | G06N 3/045 |
| CN | 114818839 A | * | 7/2022 | G06F 18/23 |

* cited by examiner

*Primary Examiner* — Natalie Huls
(74) *Attorney, Agent, or Firm* — Vincent Duffy

(57) ABSTRACT

Systems and methods include collecting vibration data along an optical fiber cable using distributed acoustic sensing (DAS). The collected vibration data is preprocessed to separate the vibration data into at least two mixtures. The at least two mixtures are combined into a mixture of mixtures. The mixture of mixtures is separated into a plurality of estimated source signals using a separation model. The separation model is trained using an unsupervised loss computed between the estimated source signals and the at least two mixtures.

20 Claims, 4 Drawing Sheets

UNSUPERVISED TRANSFORMER SIGNAL SEPARATION

RELATED APPLICATION INFORMATION

This application claims priority to U.S. Provisional Patent Application No. 63/595,791 filed on Nov. 3, 2023, incorporated herein by reference in its entirety.

BACKGROUND

Technical Field

The present invention relates to optical fiber sensing, and more particularly, systems and methods that separate detected vibration patterns using unsupervised blind source separation.

Description of the Related Art

Aerial fiber cables are used to provide data communication services. Ambient vibration data collected on the fiber cables using Distributed Acoustic Sensing (DAS) can be analyzed to understand nearby environments. However, ambient data represent a combination of multiple signals, including transformer vibrations, traffic vibrations and other environmental noises. This poses a challenge when trying to extract useful information from a mixed signal.

SUMMARY

According to an aspect of the present invention, systems and methods include collecting vibration data along an optical fiber cable using distributed acoustic sensing (DAS). The method further includes preprocessing the collected vibration data to separate the vibration data into at least two mixtures. The method also includes combining the at least two mixtures into a mixture of mixtures. The method additionally includes separating the mixture of mixtures into a plurality of estimated source signals using a separation model, wherein the separation model is trained using an unsupervised loss computed between the estimated source signals and the at least two mixtures.

According to other aspects of the present invention, the method may include one or more of the following features. The separation model may include a deep neural network that processes a plurality of latent source signals in the mixture of mixtures. The deep neural network may be trained using a gradient descent optimization approach to minimize the unsupervised loss. The method may further include applying a denoising filter to filter the vibration data before separating the at least two mixtures. The unsupervised loss may be computed using a permutation invariant training approach. The method may further include determining a status of an electrical transformer based on at least one of the estimated source signals. The status of the electrical transformer may include at least one of: transformer health, power outage detection, or transformer position.

According to another aspect of the present invention, a system includes a distributed acoustic sensing (DAS) interrogator configured to collect vibration data along an optical fiber cable. The system also includes a preprocessor configured to separate the collected vibration data into at least two mixtures. The system further includes a mixer configured to combine the at least two mixtures into a mixture of mixtures. The system additionally includes a separation model configured to separate the mixture of mixtures into a plurality of estimated source signals, wherein the separation model is trained using an unsupervised loss computed between the estimated source signals and the at least two mixtures.

According to other aspects of the present disclosure, the system may include one or more of the following features. The separation model may include a deep neural network that processes a plurality of latent source signals in the mixture of mixtures. The preprocessor may include a denoising filter to filter vibration data before separating the vibration data into the at least two mixtures. The unsupervised loss may be computed using a permutation invariant training approach. The system may further include an inference module configured to determine a status of an electrical transformer based on at least one of the estimated source signals. The status of the electrical transformer may include at least one of: transformer health, power outage detection, or transformer position.

According to another aspect of the present invention, a system includes a hardware processor and a memory that stores a computer program which, when executed by the hardware processor, causes the hardware processor to perform operations. The operations include collecting vibration data along an optical fiber cable using distributed acoustic sensing (DAS). The operations also include preprocessing the collected vibration data to separate the vibration data into at least two mixtures. The operations further include combining the at least two mixtures into a mixture of mixtures. The operations additionally include separating the mixture of mixtures into a plurality of estimated source signals using a separation model, wherein the separation model is trained using an unsupervised loss computed between the estimated source signals and the at least two mixtures.

According to other aspects of the present disclosure, the system may include one or more of the following features. The separation model may comprise a deep neural network that processes a plurality of latent source signals in the mixture of mixtures. The deep neural network may be trained using a gradient descent optimization approach to minimize the unsupervised loss. The system may further include a denoising filter to filter the vibration data before separating the at least two mixtures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
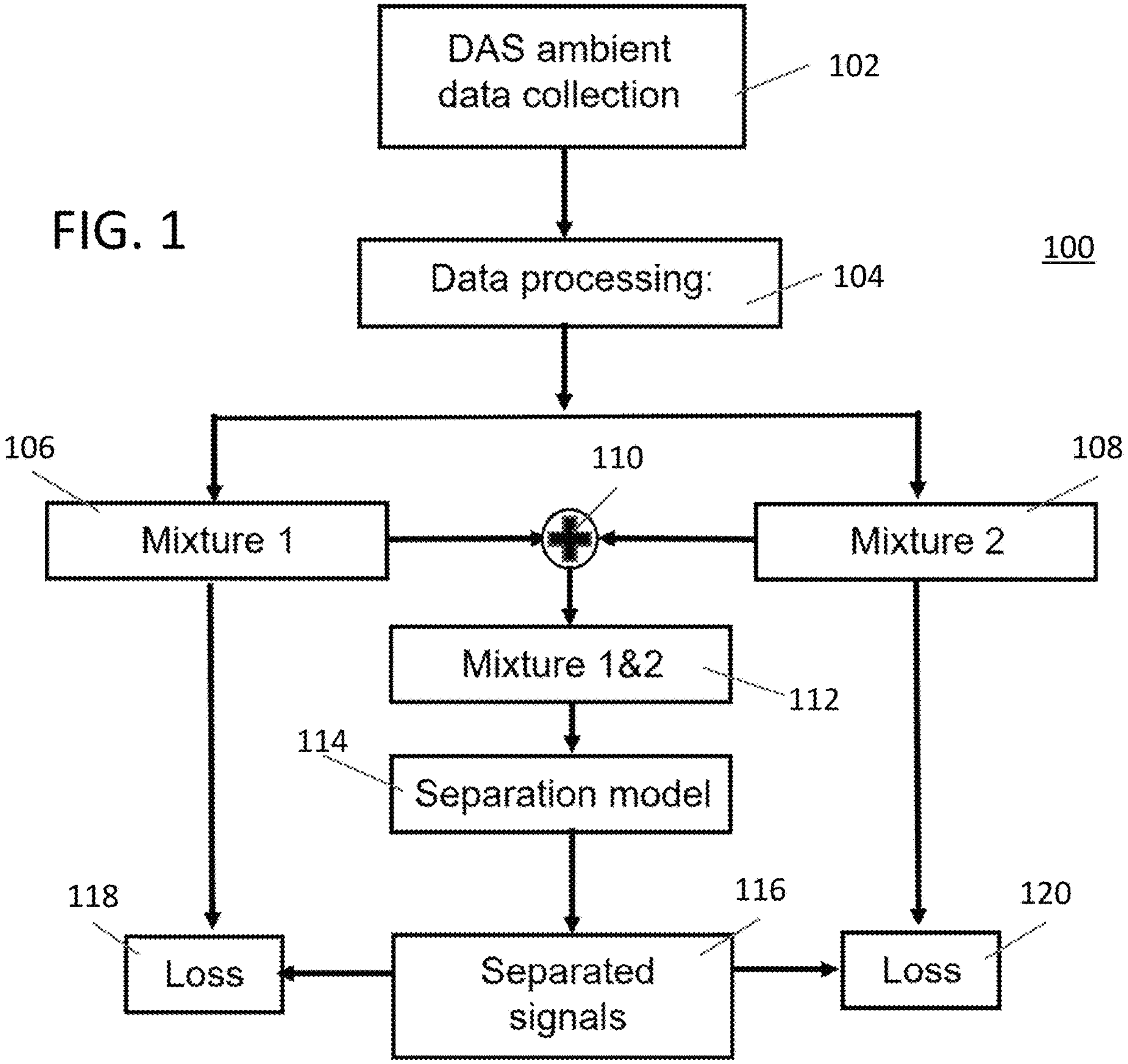
FIG. 1 is a block/flow diagram illustrating a system/method for unsupervised learning that is effective for blind signal separation, in accordance with an embodiment of the present invention.

In accordance with embodiments of the present invention, systems and methods are described that can be used to analyze vibrations and decompose the vibrations to better understand an environment surrounding sensors that collect the vibrations. For example, vibrations of electrical transformers can be used to analyze transformer vibration patterns, determine transformer positions and detect transformer health and power outages. By decomposing fiber optic sensing signals the transformer signals from collected and ambient data can be employed to provide useful information.

In an embodiment, transformer signal separation can be addressed as an unsupervised blind source separation issue. Since a ground truth vibration pattern of a single transformer is not known, the present embodiments can separate signals in a mixed style without supervision. The present invention introduces a machine learning solution for transformer signal separation based on the ambient data captured on the fiber cables. DAS is employed for data collection and can capture acoustic signals from every location along an aerial fiber cable concurrently. An entire aerial fiber cable is constantly vibrated by environmental noise. In one example, vibration is aroused by the transformers, e.g., electrical transformers that e.g., top utility poles. Separating the transformer signals from other noise signals can provide an understanding of, e.g., a condition of the transformer.

A supervised approach that trains a model to predict component sources from synthetic mixtures created by adding up isolated ground-truth sources relies on the synthetic training data. Relying of synthetic training data is problematic because good performance depends upon the degree of match between the training data and real data. However, it is difficult to obtain the ground truth of every single transformer for pattern recognition. To address the blind signal separation problem, the present embodiments use an unsupervised solution using a deep neural network. Training examples are constructed by mixing together existing mixtures, and the model separates them into a variable number of latent sources, such that separated sources can be remixed to approximate original mixtures. These methods enable unsupervised domain adaptation and learning from large amounts of real-world data without ground-truth labeling.

In accordance with some embodiments, DAS technology is employed to concurrently collect ambient vibration signals from individual locations on aerial cables. This information provides valuable insights into transformer vibration patterns that traditional sensing methods may not capture. Embodiments of the present invention provide an unsupervised solution for blind source signal separation, without requiring any ground truth vibration pattern for each transformer. This significantly reduces efforts to collect and label the transformer signals. A deep learning method learns a feature representation from complex real-world data in an unsupervised learning setting, which improves accuracy and sensitivity when analyzing signal patterns.

Referring now in detail to the figures in which like-numerals represent the same or similar elements and initially to FIG. 1, a system 100 for unsupervised learning that is effective for blind transformer signal separation is shown and described in accordance with embodiments of the present invention, which can achieve superior performance even without any ground truth data. For data collection in block 102, a DAS can monitor acoustic vibrations with meter-scale or better spatial resolution in real time. Preprocessing, in block 104, separates the original DAS data from block 102 into multiple mixtures. In this example, data processing in block 104 separates the data into, e.g., two mixtures, mixture 1 106 and mixture 2 108. It should be understood that additional mixtures can be employed and that the number of mixtures can be greater than two.

The system 100 generalizes permutation invariant training, in that a permutation used to match source estimates to source references is transformed to allow a combination of some of the sources. Instead of single-source references, the system 100 uses mixtures, mixture 1 106 and mixture 2 108, from a target domain (e.g., DAS data from transformers) as references. A mixer 110 or summer mixes all or part of mixture 1 106 and mixture 2 108, in block 112. Mixture 1&2 from block 112 is formed by summing together these mixtures to form a mixture of mixtures. The mixture of mixtures is input to a separation model 114. The separation model 114 is trained to separate this input into a variable number of latent sources, such that separated component signals 116 can be remixed to approximate the original mixtures.

The mixtures are selected by combining multiple raw signals from the Distributed Acoustic Sensing (DAS) data. The selection process involves taking different sections or portions of the raw signals, which represent various vibration events or noise sources, and summing them together to create mixtures. These mixtures are designed to simulate the complex, real-world conditions where multiple signals overlap. The selection process can be either random or guided by domain-specific knowledge.

The separation model 114 utilized in this framework is a neural network-based architecture designed to estimate latent sources from mixtures 1, 2 and 1&2 of DAS data. The model processes the mixtures as inputs and separates them into a variable number of latent sources, which are then transformed using an optimized matrix A. This matrix is learned during training and enables the model to remix the latent sources in such a way that they approximate the original input mixtures. The model 114 operates using an unsupervised learning approach, where the mixtures themselves serve as references for training rather than labeled ground truth data. The training objective is to minimize loss functions 118, 120 that measures the difference between the estimated sources, after being transformed by matrix A, and the original input mixtures. This enables the model to effectively separate complex overlapping signals without requiring labeled data, making it highly suitable for real-world applications involving noisy and entangled signals.

In this framework, matrix A is used to transform the estimated latent sources to best approximate the original input mixtures. For example, if the model estimates two latent sources from DAS data, matrix A adjusts the contributions of each source to the mixtures. The matrix A might determine that the first mixture is primarily made up of the first source with some contribution from the second source, while the second mixture could be a more balanced combination of both sources. Through training, the model learns the optimal values for matrix A, allowing it to remix the estimated sources in a way that closely matches the original input mixtures. This process ensures that the model can effectively separate overlapping signals and reconstruct the original data.

In block 102, data collection and labeling are performed. A DAS located at one end of an optical fiber can capture real-time acoustic vibrations along tens of kilometers of fiber optic cables with at least meter-scale spatial resolution. Recorded raw data are collected from fiber routes that include multiple transformers. The signal mixed with transformers, traffic, and environmental noises is considered a mixture of sources, which can be used for model training directly.

In block 104, data preprocessing is performed. The preprocessing includes separating the raw data into multiple mixtures. Then, the mixture data are further partitioned into training, validation, and testing sets. Note a denoising filter can be employed on the raw data to remove unwanted signals, e.g., high-frequency noises.

The separation model 114 can undergo unsupervised model training. The unsupervised training framework only needs the mixtures of vibration data. The ultimate training goal that matches source estimates to source references is relaxed to permit summation of some of the sources.

The separation model 114 includes a machine learning component designed to decompose mixed signals into their constituent source signals. In an embodiment, the separation model 114 may be implemented as a deep neural network (e.g., convolutional or recurrent neural networks) trained to separate mixed vibration data collected from distributed acoustic sensing (DAS) systems into individual source signals. The separation model 114 may take as input a mixture of vibration signals and output estimates of the original source signals that were combined to create that mixture. For transformer signal separation, the separation model 114 isolates vibration patterns, e.g., transformer vibrations from other environmental noises and vibrations present in the DAS data. The separation model 114 includes an unsupervised training approach, not requiring labeled ground truth data for individual sources and can handle a variable number of latent source signals in the input mixture. To minimize the difference between remixed separated component signals 116 and original input mixtures (e.g., mixture 1 106 and mixture 2 108), an optimization is performed to minimize losses 118 and 120.

The separation model 114 can leverage techniques from blind source separation and independent component analysis, adapted for the specific challenges of DAS data. Its performance may be evaluated based on how well the separated signals can be recombined to approximate the original mixed inputs. The separation model 114 provides adaptability to different environmental conditions and fiber optic sensing setups. Unsupervised model training refers to a machine learning approach where the separation model 114 is trained using only mixed vibration data inputs, without labeled ground truth data for individual sources.

The separation model 114 learns to separate mixed signals into component sources without supervision. The mixture of mixtures refers to a composite signal created by combining two or more mixed vibration signals, each of which already contains multiple source components. This higher-order mixture serves as input for the separation model 114 during training. Unsupervised loss is an error metric computed between the separated component signals 116 (which can be estimated) output by the separation model 114 and the original input mixtures (e.g., mixture 1 106 and mixture 2 108), without reference to ground truth individual sources. This loss guides the optimization of the separation model 114 in the absence of supervised labels. The separated component signals 116 output by the separation model 114 are "estimated sources" given a mixed input signal. These represent the separation model's attempt to decompose the mixture into its constituent source signals.

An unsupervised loss 118 for mixture 1 106 against the mixture of mixtures in block 112 and an unsupervised loss 120 for mixture 2 108 against the mixture of mixtures in block 112 can be computed between estimated sources $\hat{s}$ (estimated by the separation model 114) and input mixtures $x_1$ and $x_2$ as follows:

$$L(x_1, x_2, \hat{s}) = \min_A \sum_{i=l}^{2} L(x_i, [A\hat{s}]_i),$$

where the loss function minimizes a total loss between sources (signals) and mixtures to obtain an optimized matrix A, in an unsupervised matter. Once trained, the separation model 114 can be inferenced to determine a status of, e.g., an electrical transformer, based on acoustic data collected from, e.g., a fiber optic cable. Data from different fiber routes can be employed to show the effectiveness of the present embodiments for domain adaptation to different acoustic vibration characteristics. In some embodiments, the systems described herein can be employed in determining aspects of electrical transformers; however, the present embodiments are not limited to this application and can be employed in monitoring roadways, bridges, traffic patterns, pedestrian traffic, or any other distributed system.

The systems described herein and in particular the separation model 114 can include an Artificial Machine learning system that can be used to predict outputs or outcomes based on input data, e.g., fiber optic acoustic data. In an example, given a set of input data, a machine learning system can predict an outcome. The machine learning system will likely have been trained on much training data in order to generate its model. It will then predict the outcome based on the model.

While there is no need to label or extract source signals individually, the present systems can be employed to provide mixed labels for multiple vibrational sources as a substitute of single source class levels that would otherwise by employed to identify sound sources.

In some embodiments, the artificial machine learning system includes an artificial neural network (ANN). One element of ANNs is the structure of the information processing system, which includes a large number of highly interconnected processing elements (called "neurons") working in parallel to solve specific problems. ANNs are furthermore trained using a set of training data, with learning that involves adjustments to weights that exist between the neurons. An ANN is configured for a specific application, such as pattern recognition or data classification, through such a learning process.

The present embodiments may take any appropriate form, including any number of layers and any pattern or patterns of connections therebetween. ANNs demonstrate an ability to derive meaning from complicated or imprecise data and can be used to extract patterns and detect trends that are too complex to be detected by humans or other computer-based systems. The structure of a neural network is known generally to have input neurons that provide information to one or more "hidden" neurons. Connections between the input neurons and hidden neurons are weighted, and these weighted inputs are then processed by the hidden neurons according to some function in the hidden neurons. There can be any number of layers of hidden neurons, and as well as neurons that perform different functions. There exist different neural network structures as well, such as a convolutional neural network, a maxout network, etc., which may vary according to the structure and function of the hidden layers, as well as the pattern of weights between the layers. The individual layers may perform particular functions, and may include convolutional layers, pooling layers, fully connected layers, softmax layers, or any other appropriate type of neural network layer. A set of output neurons accepts and processes weighted input from the last set of hidden neurons.

This represents a "feed-forward" computation, where information propagates from input neurons to the output neurons. Upon completion of a feed-forward computation, the output is compared to a desired output available from training data. The error relative to the training data is then processed in "backpropagation" computation, where the hidden neurons and input neurons receive information regarding the error propagating backward from the output neurons. Once the backward error propagation has been completed, weight updates are performed, with the weighted connections being updated to account for the received error. It should be noted that the three modes of operation, feed forward, back propagation, and weight update, do not overlap with one another. This represents just one variety of ANN computation, and that any appropriate form of computation may be used instead. In the present case the output neurons provide emission information for a given plot of land provided from the input of satellite or other image data.

To train an ANN, training data can be divided into a training set and a testing set. The training data includes pairs of an input and a known output. During training, the inputs of the training set are fed into the ANN using feed-forward propagation. After each input, the output of the ANN is compared to the respective known output or target. Discrepancies between the output of the ANN and the known output that is associated with that particular input are used to generate an error value, which may be backpropagated through the ANN, after which the weight values of the ANN may be updated. This process continues until the pairs in the training set are exhausted.

After the training has been completed, the ANN may be tested against the testing set or target, to ensure that the training has not resulted in overfitting. If the ANN can generalize to new inputs, beyond those which it was already trained on, then it is ready for use. If the ANN does not accurately reproduce the known outputs of the testing set, then additional training data may be needed, or hyperparameters of the ANN may need to be adjusted.

ANNs may be implemented in software, hardware, or a combination of the two. For example, each weight may be characterized as a weight value that is stored in a computer memory, and the activation function of each neuron may be implemented by a computer processor. The weight value may store any appropriate data value, such as a real number, a binary value, or a value selected from a fixed number of possibilities, which is multiplied against the relevant neuron outputs. Alternatively, the weights may be implemented as resistive processing units (RPUs), generating a predictable current output when an input voltage is applied in accordance with a settable resistance.

A neural network becomes trained by exposure to empirical data. During training, the neural network stores and adjusts a plurality of weights that are applied to the incoming empirical data. By applying the adjusted weights to the data, the data can be identified as belonging to a particular predefined class from a set of classes or a probability that the input data belongs to each of the classes can be output.

The empirical data, also known as training data, from a set of examples can be formatted as a string of values and fed into the input of the neural network. Each example may be associated with a known result or output. Each example can be represented as a pair, (x, y), where x represents the input data and y represents the known output. The input data may include a variety of different data types, and may include multiple distinct values. The network can have one input node for each value making up the example's input data, and a separate weight can be applied to each input value. The input data can, for example, be formatted as a vector, an array, or a string depending on the architecture of the neural network being constructed and trained.

The neural network "learns" by comparing the neural network output generated from the input data to the known values of the examples, and adjusting the stored weights to minimize the differences between the output values and the known values. The adjustments may be made to the stored weights through back propagation, where the effect of the weights on the output values may be determined by calculating the mathematical gradient and adjusting the weights in a manner that shifts the output towards a minimum difference. This optimization, referred to as a gradient descent approach, is a non-limiting example of how training may be performed. A subset of examples with known values that were not used for training can be used to test and validate the accuracy of the neural network.

During operation, the trained neural network can be used on new data that was not previously used in training or validation through generalization. The adjusted weights of the neural network can be applied to the new data, where the weights estimate a function developed from the training examples. The parameters of the estimated function which are captured by the weights are based on statistical inference.

A deep neural network, such as a multilayer perceptron, can have an input layer of source nodes, one or more computation layer(s) having one or more computation nodes, and an output layer, where there is a single output node for each possible category into which the input example could be classified. An input layer can have a number of source nodes equal to the number of data values in the input data. The computation nodes in the computation layer(s) can also be referred to as hidden layers because they are between the source nodes and output node(s) and are not directly observed. Each node in a computation layer generates a linear combination of weighted values from the values output from the nodes in a previous layer, and applies a non-linear activation function that is differentiable over the range of the linear combination. The weights applied to the value from each previous node can be denoted, for example, by $w_1, w_2, \ldots w_{n-1}, w_n$. The output layer provides the overall response of the network to the input data. A deep neural network can be fully connected, where each node in a computational layer is connected to all other nodes in the previous layer, or may have other configurations of connections between layers. If links between nodes are missing, the network is referred to as partially connected.

Figure 2:
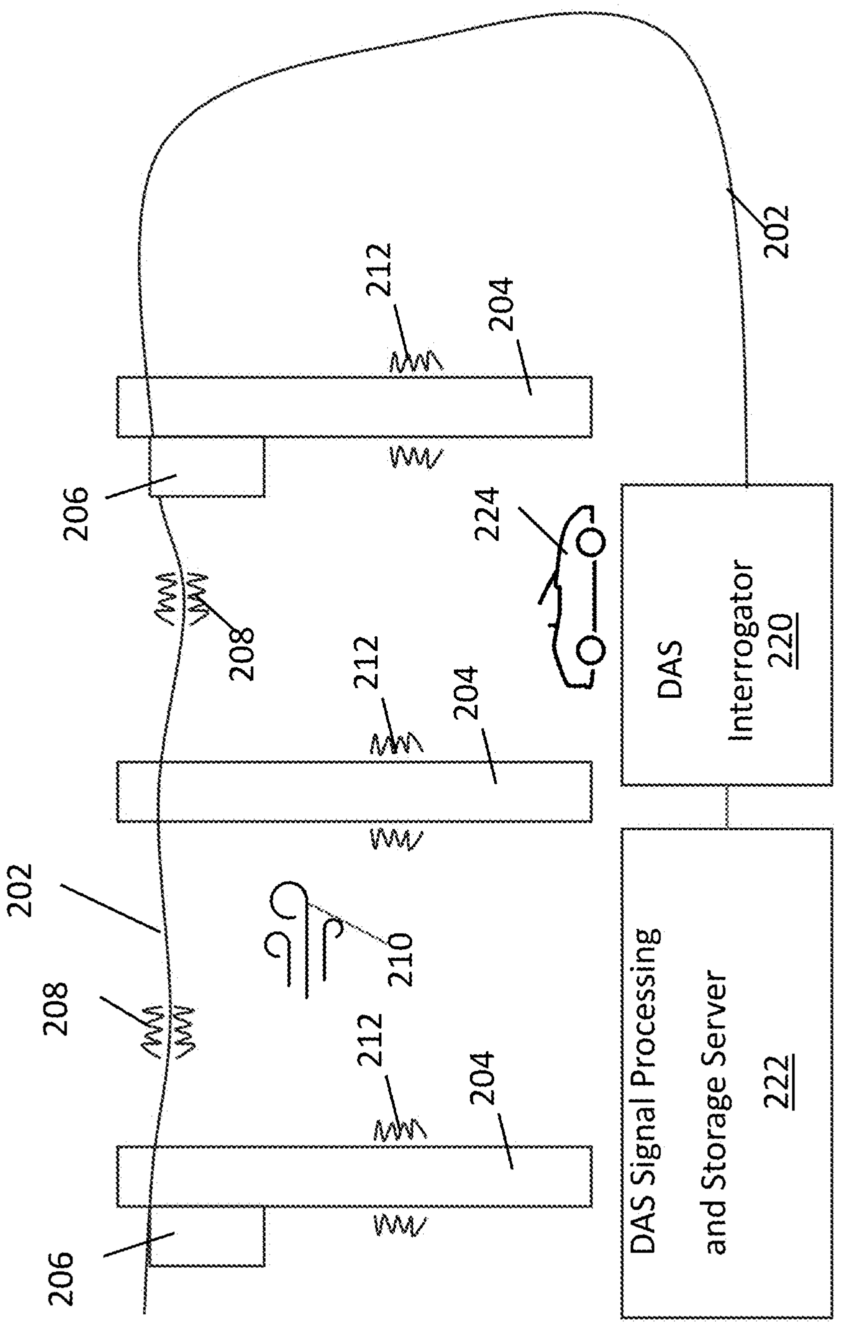
FIG. 2 is a block/flow diagram showing system including a Distributed Acoustic Sensing (DAS) interrogator to determine a status of electrical transformers, in accordance with an embodiment of the present invention.

Referring to FIG. 2, an optical fiber cable 202 can include a Distributed Acoustic Sensing (DAS) interrogator 220 located at an end of the optical fiber cable 202 that can capture real-time acoustic vibrations along the optical fiber cable 202. The optical fiber cable 202 can be meters or kilometers long. The DAS signals can provide meter-scale or better spatial resolution. Data can be collected from fiber routes that contain multiple transformers 206. The signals are mixed with acoustic data from transformers 206, traffic 224, vibrations 208 over the optical fiber cable 202, vibrations 212 over the transformers 206, environmental noises 210, etc., which are considered as a mixture of sources, which can be directly used for model training. The data can be stored and processed by DAS signal processing and storage server 222.

Once trained, the separation model 114 can be inferenced to determine a status of, e.g., an electrical transformer, based on acoustic data collected from, e.g., a fiber optic cable. An inference module or interface can be installed on the DAS signal processing and storage server 222. The DAS signal processing and storage server 222 can be employed to decode acoustic vibration information collected by the cable 202. The cable 202 can be employed as a sensor to determine a state of each of the transformers 206 or even events occurring in a vicinity of the transformers 206 or the cable 202. For example, the transformers 206 can be monitored, local traffic can be monitored and other events, etc. can be monitored using the cable 202.

Figure 3:
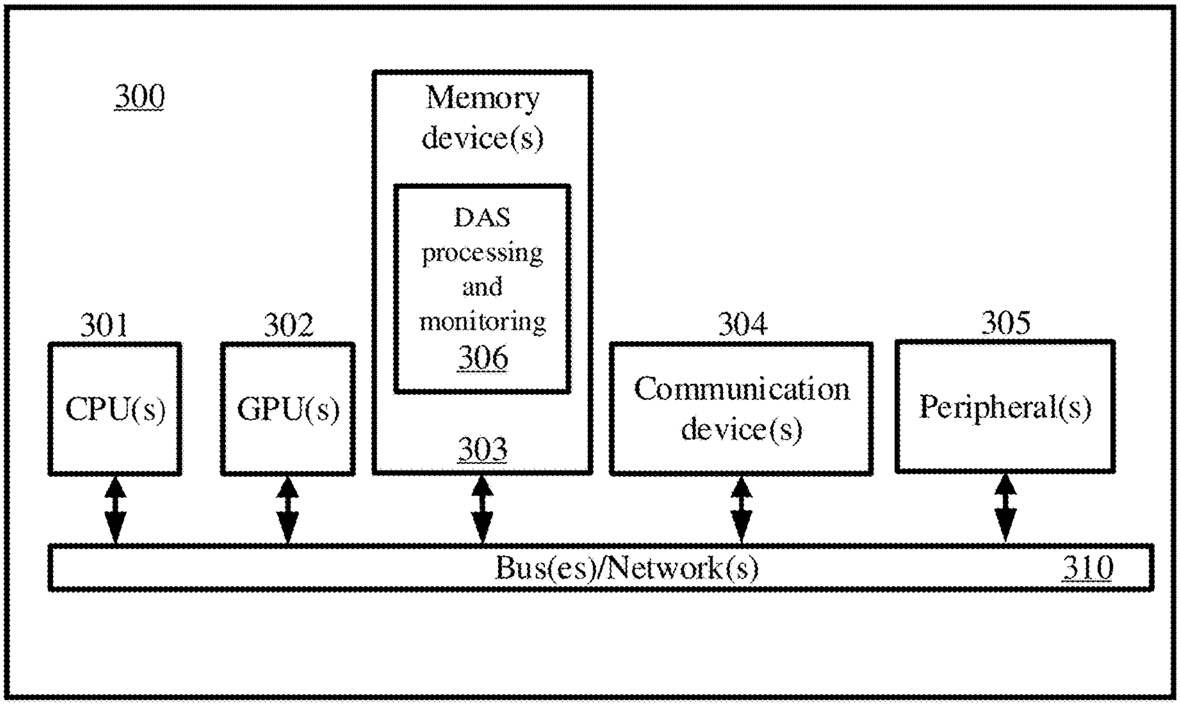
FIG. 3 is a block/flow diagram showing a computer system for training, processing and monitoring a DAS system, in accordance with an embodiment of the present invention.

Referring to FIG. 3, a block diagram is shown for an exemplary processing system 300, in accordance with an embodiment of the present invention. The processing system 300 includes a set of processing units (e.g., CPUs) 301, a set of GPUs 302, a set of memory devices 303, a set of communication devices 304, and a set of peripherals 305. The CPUs 301 can be single or multi-core CPUs. The GPUs 302 can be single or multi-core GPUs. The one or more memory devices 303 can include caches, RAMs, ROMs, and other memories (flash, optical, magnetic, etc.). The communication devices 304 can include wireless and/or wired communication devices (e.g., network (e.g., WIFI, etc.) adapters, etc.). The peripherals 305 can include a display device, a user input device, a printer, an imaging device, and so forth. Elements of processing system 300 are connected by one or more buses or networks (collectively denoted by the figure reference numeral 310).

In an embodiment, memory devices 303 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

In an embodiment, memory devices 303 store program code for implementing one or more functions of the systems and methods described herein for programmed software 306 including DAS processing and monitoring, which can separate and mix signals for DAS processing and determine a status of transformers or other equipment or events in a vicinity of each transformer. The memory devices 303 can store program code for implementing one or more functions of the systems and methods described herein.

Of course, the processing system 300 may also include other elements (not shown), as readily contemplated by one of skill in the art, as well as omitting certain elements. For example, various other input devices and/or output devices can be included in processing system 300, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 300 are readily contemplated by one of ordinary skill in the art given the teachings of the present invention provided herein.

Moreover, it is to be appreciated that various figures as described with respect to various elements and steps relating to the present invention that may be implemented, in whole or in part, by one or more of the elements of system 300.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor—or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), field-programmable gate arrays (FPGAs), and/or programmable logic arrays (PLAs). These and other variations of a hardware processor subsystem are also contemplated in accordance with embodiments of the present invention.

Figure 4:
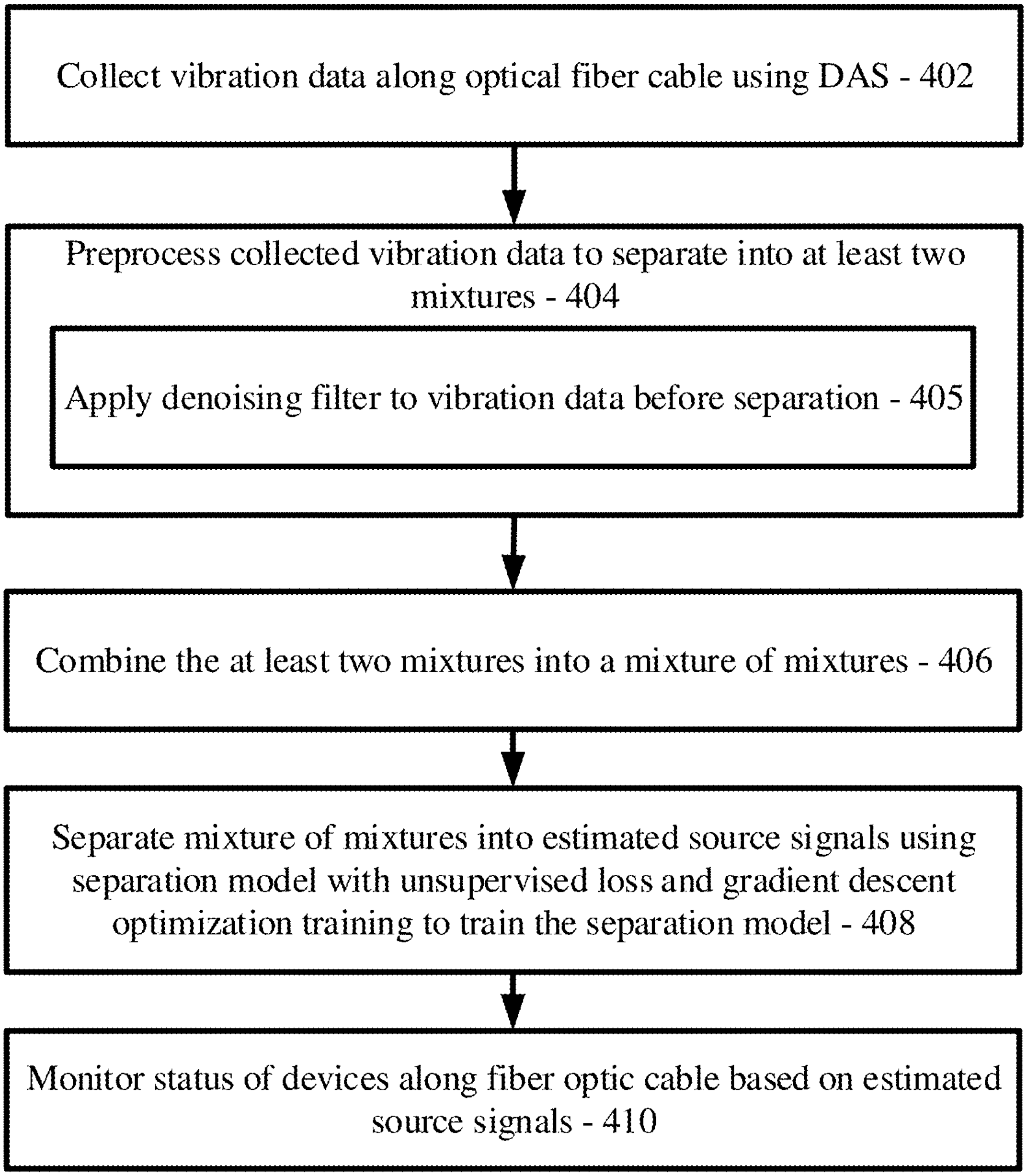
FIG. 4 is a flow diagram showing methods for training, processing and monitoring a DAS system, in accordance with an embodiment of the present invention.

Referring to FIG. 4, a system and computer-implemented methods for unsupervised vibrational signal separation is described and shown in accordance with embodiments of the present invention. In clock 402, vibration data is collected along an optical fiber cable using distributed acoustic sensing (DAS). In block 404, the collected vibration data is preprocessed to separate the vibration data into at least two mixtures. In block 405, a denoising filter is applied to filter the vibration data before separating the at least two mixtures.

In block 406, the at least two mixtures are combined into a mixture of mixtures. In block 408, the mixture of mixtures is separated into a plurality of estimated source signals using a separation model. The separation model is trained using an unsupervised loss computed between the estimated source signals and the at least two mixtures. The separation model includes a deep neural network that processes a plurality of latent source signals in the mixture of mixtures. The deep neural network can be trained using a gradient descent optimization approach to minimize the unsupervised loss. The unsupervised loss can be computed using a permutation invariant training approach.

In block 410, a status of a devices distributed along the fiber optic cable can be monitored based on at least one of the estimated source signals. For example, electrical transformers can be monitored for one or more of transformer health, power outage detection, transformer position or other aspects or properties. Other equipment and other events in the vicinity of the cable can also be monitored.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method, comprising:

collecting vibration data along an optical fiber cable using distributed acoustic sensing (DAS);

preprocessing the vibration data to separate the vibration data into at least two mixtures;

combining the at least two mixtures into a mixture of mixtures; and separating the mixture of mixtures into a plurality of estimated source signals using a separation model, wherein the separation model is trained using an unsupervised loss computed between the plurality of estimated source signals and the at least two mixtures.

2. The method of claim 1, wherein the separation model comprises a deep neural network that processes a plurality of latent source signals in the mixture of mixtures.

3. The method of claim 2, wherein the deep neural network is trained using a gradient descent optimization approach to minimize the unsupervised loss.

4. The method of claim 1, further comprising applying a denoising filter to filter the vibration data before separating the at least two mixtures.

5. The method of claim 1, wherein the unsupervised loss is computed using a permutation invariant training approach.

6. The method of claim 1, further comprising determining a status of an electrical transformer based on at least one of the plurality of estimated source signals.

7. The method of claim 6, wherein the status of the electrical transformer includes at least one of: transformer health, power outage detection, or transformer position.

8. A system, comprising:

a distributed acoustic sensing (DAS) interrogator configured to collect vibration data along an optical fiber cable;

a preprocessor configured to separate the vibration data into at least two mixtures;

a mixer configured to combine the at least two mixtures into a mixture of mixtures; and a separation model configured to separate the mixture of mixtures into a plurality of estimated source signals, wherein the separation model is trained using an unsupervised loss computed between the plurality of estimated source signals and the at least two mixtures.

9. The system of claim 8, wherein the separation model comprises a deep neural network that processes a plurality of latent source signals in the mixture of mixtures.

10. The system of claim 8, wherein the preprocessor includes a denoising filter to filter vibration data before separating the vibration data into the at least two mixtures.

11. The system of claim 8, wherein the unsupervised loss is computed using a permutation invariant training approach.

12. The system of claim 8, further comprising an inference module configured to determine a status of an electrical transformer based on at least one of the plurality of estimated source signals.

13. The system of claim 12, wherein the status of the electrical transformer includes at least one of: transformer health, power outage detection, or transformer position.

14. A system, comprising:

a hardware processor; and a memory that stores a computer program which, when executed by the hardware processor, causes the hardware processor to:

collect vibration data along an optical fiber cable using distributed acoustic sensing (DAS);

preprocess the vibration data to separate the vibration data into at least two mixtures;

combine the at least two mixtures into a mixture of mixtures; and separate the mixture of mixtures into a plurality of estimated source signals using a separation model, wherein the separation model is trained using an unsupervised loss computed between the plurality of estimated source signals and the at least two mixtures.

15. The system of claim 14, wherein the separation model comprises a deep neural network that processes a plurality of latent source signals in the mixture of mixtures.

16. The system of claim 15, wherein the deep neural network is trained using a gradient descent optimization approach to minimize the unsupervised loss.

17. The system of claim 14, further comprising a denoising filter to filter the vibration data before separating the at least two mixtures.

18. The system of claim 14, wherein the unsupervised loss is computed using a permutation invariant training approach.

19. The system of claim 14, wherein the computer program further causes the hardware processor to determine a status of an electrical transformer based on at least one of the plurality of estimated source signals.

20. The system of claim 19, wherein the status of the electrical transformer includes at least one of: transformer health, power outage detection, or transformer position.

* * * * *